United States Patent [19]

Miller

[11] Patent Number: 5,417,537

[45] Date of Patent: May 23, 1995

[54] WAFER TRANSPORT DEVICE

[76] Inventor: Kenneth C. Miller, 280 Easy St., #117, Mountain View, Calif. 94043

[21] Appl. No.: 58,942

[22] Filed: May 7, 1993

[51] Int. Cl.⁶ .......................................... B65G 49/05
[52] U.S. Cl. .................................. 414/217; 414/939; 414/940; 414/935; 414/222; 414/749; 414/401; 414/584; 414/396; 104/282; 198/619; 118/719; 204/298.25
[58] Field of Search .............. 414/217, 222, 396, 225, 414/226, 220, 222, 749, 416, 403, 935, 937, 939, 940, 941, 401, 584; 118/719, 500; 104/281, 282, 283, 284; 204/298.25; 180/167, 7.1; 198/345.3, 345.1, 619

[56] References Cited

U.S. PATENT DOCUMENTS

| | | | |
|---|---|---|---|
| 4,042,128 | 8/1977 | Shrader | 414/939 X |
| 4,542,712 | 9/1985 | Sato et al. | 414/939 X |
| 4,624,617 | 11/1986 | Belna | 104/282 X |
| 4,676,884 | 6/1987 | Dimock et al. | 414/220 X |
| 4,766,993 | 8/1988 | Kita et al. | 198/619 |
| 4,779,538 | 10/1988 | Fujiwara et al. | 104/282 |
| 5,215,420 | 6/1993 | Hughes et al. | 414/939 X |
| 5,234,303 | 8/1993 | Koyano | 414/222 X |
| 5,284,411 | 2/1994 | Enomoto et al. | 414/217 |

FOREIGN PATENT DOCUMENTS

| | | | |
|---|---|---|---|
| 219509 | 9/1987 | Japan | 414/217 |
| 102238 | 5/1988 | Japan | 414/940 |
| 117041 | 5/1989 | Japan | 414/939 |
| 230242 | 9/1989 | Japan | 414/939 |

OTHER PUBLICATIONS

"Automation And The Factory Of The Future Lore Or Logic?" by Robert F. Graham; Lore RFG; Mar. 14, 1989; pp. 1-26 including FIGS. 1 through 8.
Brochure by Pacific Levitation Systems, Inc.
"Magnetic And Electrical Suspensions; A Survey Of Design, Construction, And Use" by P. J. Geary; British Scientific Association, Research Report, R314, 1964; pp. v-viii, 1-20, 46-57.
Getriebe-Demontage 2060 H+2061 Modell (one sheet).
"The Big Train" brochure by Lehmann-GroB-Bahn; pp. 72 and 148.
"Specification For Inter-Equipment Material Transport Interface", SEMI E-15-91, pp. 91-97.
"Standard Mechanical Interface (SMIF)", SEMI E1-9-91, pp. 109-114.
"Cluster Tool Module Interface: Mechanical Interface And Wafer Transport Standard", SEMI E21-91, pp. 133-139.
"Specification for Cassette Transfer Parallel I/O Interface", SEMI E23-91, pp. 151-161.
"Cluster Tool Module Inteface: Module Access Guideline", SEMI E25-92, pp. 167-169.
"Radial Cluster Tool Footprint Standard", SEMI E2-6-92, pp. 171-175.

*Primary Examiner*—Frank E. Werner
*Attorney, Agent, or Firm*—Limbach & Limbach

[57] ABSTRACT

An apparatus for transporting material, such as semiconductor wafers, between process modules coupled to a chamber. The transport apparatus includes a chamber; guide rails affixed to an outer surface of the chamber; one or more material transporters each including a motorized vehicle positioned outside the chamber and movable along the guide rails, a material carrier positioned inside the chamber, and magnetic levitation means for magnetically coupling the material carrier to the motorized vehicle through a nonmagnetic wall of the chamber; and a controller that controls the position of the motorized vehicle along the guide devices to move the material carrier to desired positions within the chamber.

28 Claims, 8 Drawing Sheets

WAFER TRANSPORT DEVICE

BACKGROUND OF THE INVENTION

1. Field of the Invention

This invention relates generally to a transport device for moving semiconductor or other wafers between and among processing stations, and relates more particularly to a wafer transporter that utilizes magnetic levitation to Operatively connect a wafer carrier inside a sealed chamber to a guided transport mechanism on top of the sealed chamber.

2. Description of the Relevant Art

Wafer handling in the fabrication of semiconductor devices involves moving a wafer from point A to point B accurately and reliably, and contaminating the wafer as little as possible. Wafers may be handled separately or in cassettes that carry several wafers.

A trend is toward automated wafer handling, in other words, using automated equipment for moving wafers between processing equipment. Automated wafer handling can be done by a robot vehicle that transports cassettes of wafers and transfers cassettes among several pieces of process equipment, or by a transport vehicle that transports cassettes of wafers to cassette transfer robots dedicated to each piece of process equipment, or by a cassette transfer robot between two pieces of process equipment. The robots and/or transport vehicles are operated within clean rooms. One drawback to these devices for automated wafer handling is that the moving mechanisms generate particles within the clean rooms and thereby contaminate the wafers and the clean rooms.

Summary of the Invention

In accordance with the illustrated preferred embodiment, the present invention provides an apparatus for transporting material, including but not limited to semiconductor wafers, between process modules coupled to a sealed chamber. The transport apparatus includes a sealed chamber having a plurality of docking ports; guide rails affixed to an outer surface of the sealed chamber and extending past the docking ports; one or more material transporters each including a motorized vehicle positioned outside the sealed chamber and movable along the guide rails, a material carrier positioned inside the sealed chamber, and magnetic levitation means for magnetically coupling the material carrier to the motorized vehicle through a nonmagnetic wall of the sealed chamber; and a controller that controls the position of the motorized vehicle along the guide means to move the material carrier to the docking ports and other desired positions within the sealed chamber.

The present invention also comprises the material transporter itself, which includes the motorized vehicle, the material carrier, and the magnetic levitation means that couples the material carrier to the motorized vehicle. The present invention further comprises a transport module having a sealed chamber, an interface for coupling to an adjacent transport module, and guide tracks mounted outside and on top of the sealed chamber.

The present invention has several advantageous features. An important feature is that the present invention transports wafers or other material inside a sealed chamber while minimizing particle generation. Only the material carrier is inside the sealed chamber and since it contains no moving parts, it will not generate particles, at least so long as the levitation system prevents it from contacting the sealed chamber. Except at docking, there is no contact between moving parts, so no contaminating lubricants are needed within the sealed chamber. Furthermore, if the sealed chamber is evacuated, the vacuum itself eliminates air-borne contaminants.

Preferably, the transport apparatus is made up of several adjacent transport modules joined together in a row to form an extended sealed chamber linking several process modules or cluster tools. Each process module or cluster of process modules are directly or indirectly coupled via transfer robots or other wafer transfer devices to a docking port of the transport apparatus of the present invention. One or more cassette loaders/unloaders are coupled to the transport modules for transferring raw wafers into and completed wafers out of the sealed chamber. Once inside the sealed chamber, the wafers are transported to several process modules for any or all processing. The guide rails of the transport modules are interconnected with connecting tracks and switches so that transporters can transfer wafers between and among all process modules. The process modules need not be arranged in any predetermined order because the guide rails are configured to allow the transporters to access or bypass any process module. If the processing line needs to be expanded, one or more additional transport modules can be added. Additional transport modules can be added either directly, allowing the same material transporters to be used, or indirectly through a transfer robot, requiring separate material transporters.

Also preferably, the sealed chamber is a vacuum chamber, with the vacuum provided by one or more vacuum pumps. Alternatively, the sealed chamber can be backfilled with a clean, inert gas or mixture of gases.

The present invention provides a docking port adjacent to a transfer robot for each process module (or cluster of process modules) through which port the wafers are transferred by the transfer robot between the transporters and process modules. A guide rail adjacent to the docking port provides a buffer or staging area for transporters waiting to gain access to the transfer robot of a process module or cluster tool. Movement of each material transporter is independently controllable to provide maximum flexibility in material routing.

Another important feature of the present invention is that the parts most often requiring service, mechanical, electrical, and electromagnetic, are all located outside the sealed chamber for ease of testing, replacement, and service. Also important is the cost savings realized by using available model train parts for the guide rails, switches, and a motor and running gear of the motorized vehicle.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENT

FIGS. 1 through 17 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a wafer transport system and its associated transporter apparatus that utilizes magnetic levitation to operatively connect a wafer carrier inside a sealed chamber to a guided transport mechanism on top of the sealed chamber. Shown in FIG. 1 in plan view is a wafer transport system 10, according to the present invention, that includes, for example, seven transport modules 12 that transport wafers between seven transfer robots 14. The transfer robots 14 in turn transfer the wafers between the wafer transport system 10 and various process modules 40, 44, and 46 and cassette loaders 16.

Figure 1:
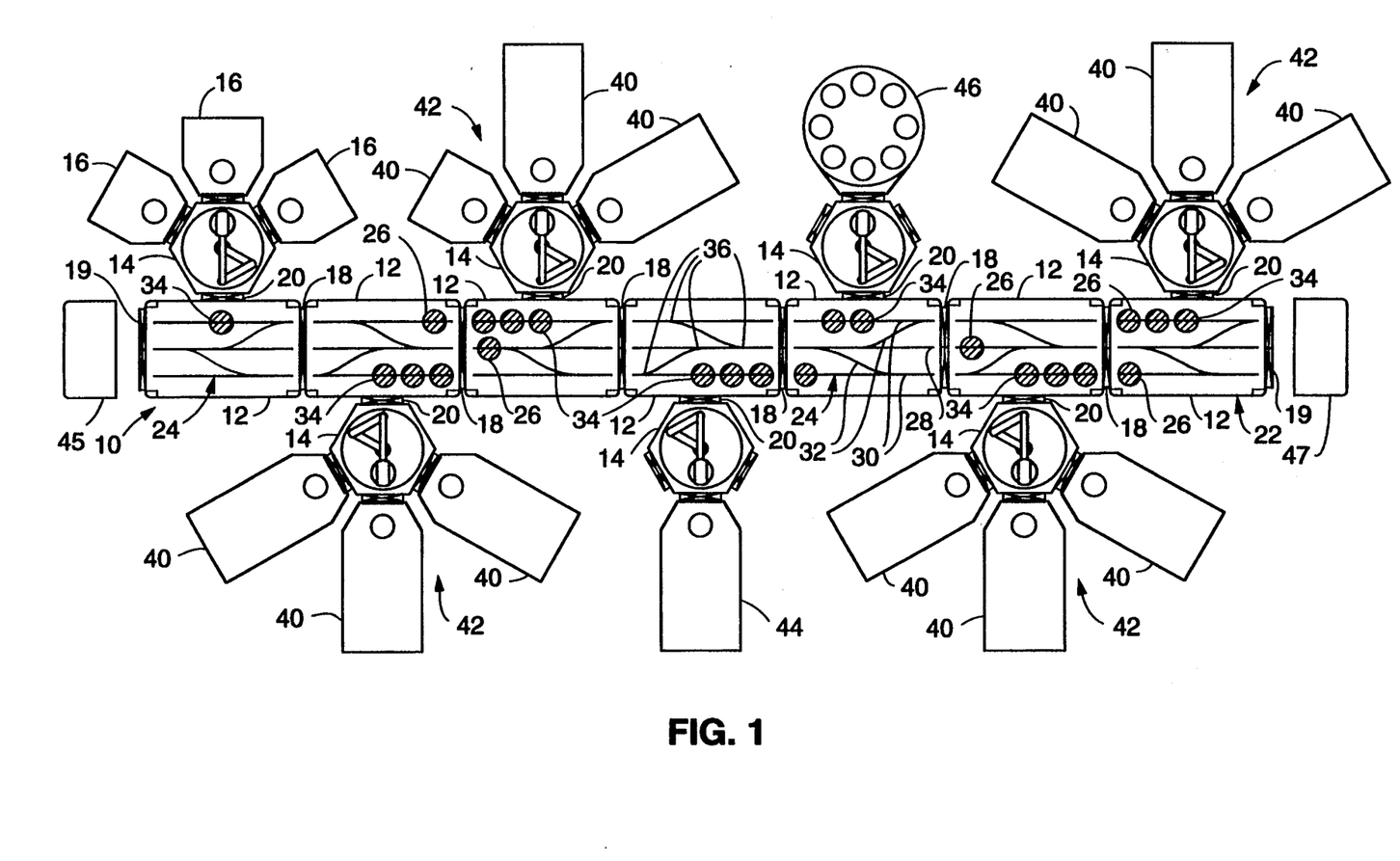
FIG. 1 is a plan view of a processing line utilizing several transport modules and material transporters according to the present invention.

Each transport module 12 is rectangular in shape in plan view and has two intermodule interfaces 18 on opposite ends and a transfer robot interface 20 on one side. The intermodule interfaces 18 couple each transport module 12 to another transport module. The transfer robot interfaces 20 couple each transport module 12 to a transfer robot 14. The interconnected transport modules 12 extend in a row and provide the means, further described below, for transporting individual wafers between the transfer robots 14 and the cassette loaders 16. The intermodule interfaces 18 at each end of the line are closed off with covers 19.

Wafers to be processed are loaded into the wafer transport system 10 by a transfer robot 14 from a cassette loader 16, are transported to the other transfer robots 14 and process modules 40, 44, and 46 coupled thereto, and, when processing is completed, are transferred out of the wafer transport system to a cassette loader 16.

The wafer transport system 10 has a sealed chamber 22 extending throughout to each of the intermodule interfaces 18 and transfer robot interfaces 20. As explained in more detail below, the overall sealed chamber of the wafer transport system 10 is created by connecting the individual sealed chambers of the transport modules 12 at the intermodule interfaces 18.

On top of the extended sealed chamber 22 are guide tracks 24 that guide wafer transporters 26 between docking ports 34 adjacent to the transfer robots 14. Preferably, the guide tracks 24 include three parallel tracks (a central track 28 and two outer tracks 30), plus two connecting tracks 32 per transport module 12. One of the outer tracks 30 passes by the transfer robot interface 20 of each transport module 12. Adjacent to each transfer robot interface 20 is a docking port 34 at which location a transporter 26 is positioned during wafer transfer to or from a transfer robot 14. Transporters can be staged or buffered along the outer track 30 next to the docking port and can be moved to the docking port when it is available.

The central track 28 and the connecting tracks 32 are utilized to route transporter traffic to the appropriate docking port 34 or staging area. Track switches 36 are located at the junctions between the tracks and are controlled by a system controller. Since the central track 28 by-passes all of the docking ports and staging areas, a wafer can be transported anywhere in the wafer transport system 10 by routing the transporter 26 down the central track, and then throwing the appropriate switches to transfer the transporter to an outer track 30 at the desired docking port 34 or staging area. A traffic routing controller controls the movement of the transporters 26 and switching of the switches 36 to avoid collisions. Portions of the outer tracks 30 may be used for switching transporter traffic to allow bidirectional movement along the central track 28.

Several of the transfer robots 14 shown in FIG. 1 supply wafers to cluster tools 42, which are independently-operable, environmentally-isolated, manufacturing systems consisting of multiple pieces of process equipment 40. The transfer robot 14 of a cluster tool 42 transfers wafers between the wafer transport system 10 and the process modules 40 within the cluster. Each cluster 14 can be configured with several pieces of process equipment that together perform a function like, for example, lithography, ion implantation, deposition, etching, or inspection. Other transfer robots 14 supply single purpose process modules 44 and 46.

Overall, the process modules 40, 44, and 46 interconnected by the transfer robots 14 and the wafer transport system 10 provide an integrated manufacturing capability. Of course, since the present invention is the wafer transport system 10 itself and components thereof, it is irrelevant what particular process equipment, cluster tools, or process modules are attached to the transport system. FIG. 1 merely illustrates the wafer transport system 10 of the present invention in a suggested configuration with several cluster tools 42 and two single purpose process modules 44 and 46. The term process module as used herein is understood to encompass all manner of process equipment, cluster tools, and other equipment that can be attached to a transfer robot interface 20 of the present invention.

FIG. 1 also illustrates diagrammatically a facilities interface 45 at one end of the wafer transport system 10 and a control interface 47 at the other end.

Figure 2:
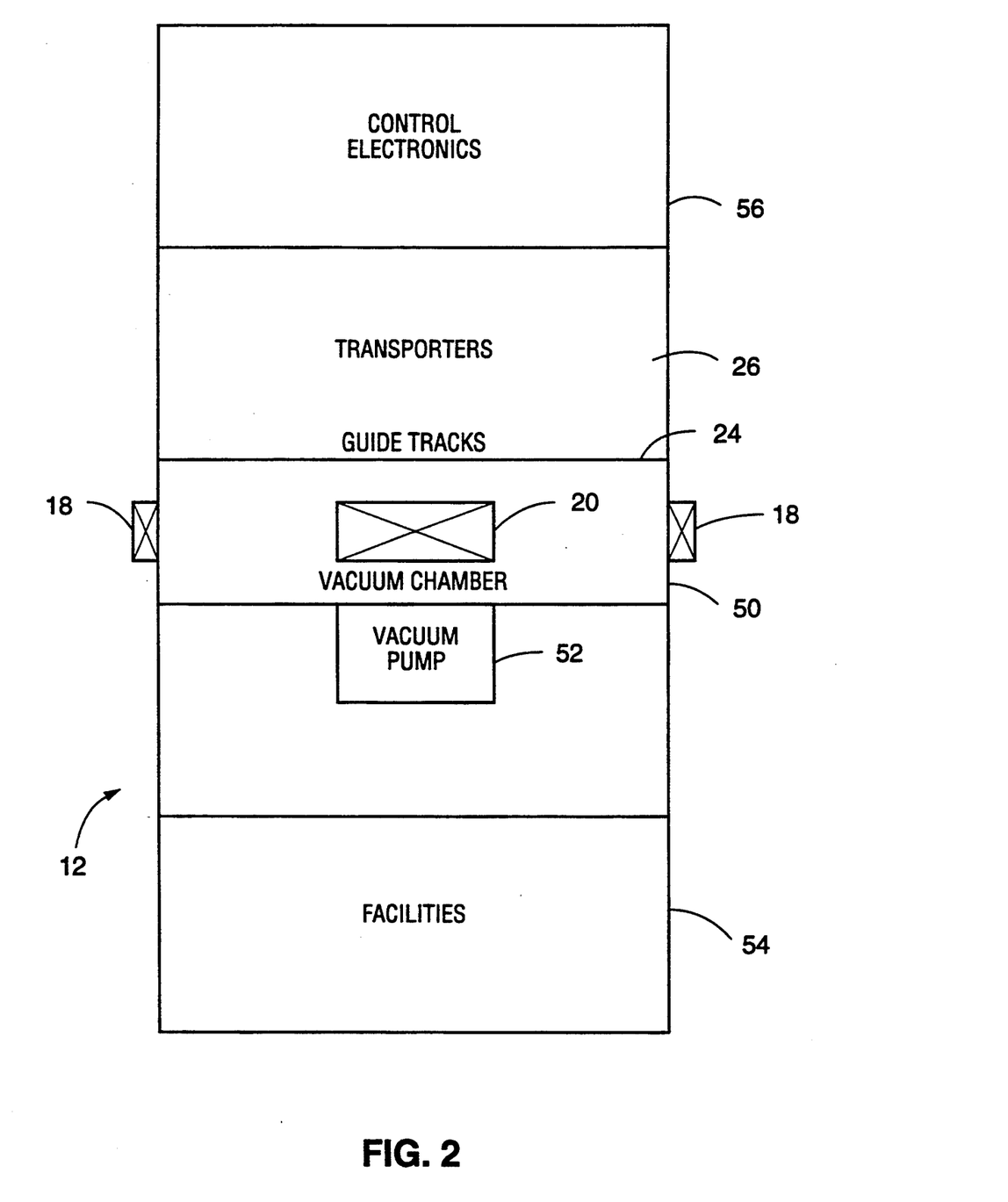
FIG. 2 is a side elevation view of a transport module according to the present invention.

FIG. 2 is a diagrammatic representation of a transport module 12, shown in side elevation. A sealed chamber 50 of the transport module 12 extends horizontally between two intermodule interfaces 18 at the ends of the module. The transfer robot interface 20 is centered at one side of the sealed chamber. The sealed chamber is described in more detail below in connection with FIGS. 5-8. Located below the sealed chamber 50 is a vacuum pump 52 and a facilities bay 54. Located above the sealed chamber 50 are guide tracks 24 and transporters 26 that ride on the guide tracks. Above the transporters is a control electronics bay 56. The facilities bays 54 are preferably open between adjacent transport modules 12, and the facilities connections converge at the facilities interface 45 at one end of the line of transport modules. Likewise, the control electronics bays 56 are preferably open between adjacent transport modules, and are wired to the control interface 47. The sealed chamber 50 is preferably evacuated by the vacuum pump 52, and may be backfilled with a clean, inert gas or gases.

Figure 3:
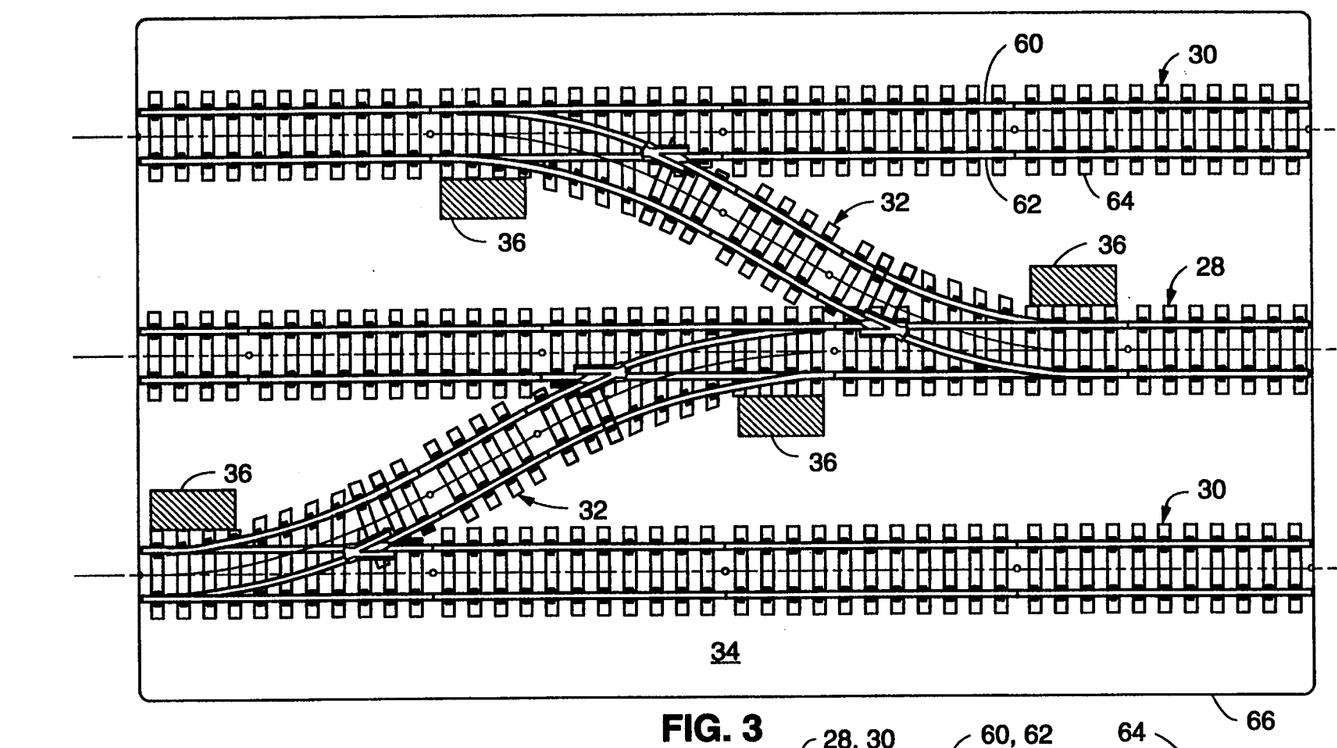
FIG. 3 is a plan view of guide tracks utilized in the transport module of FIGS. 1 and 2.
Figure 4:
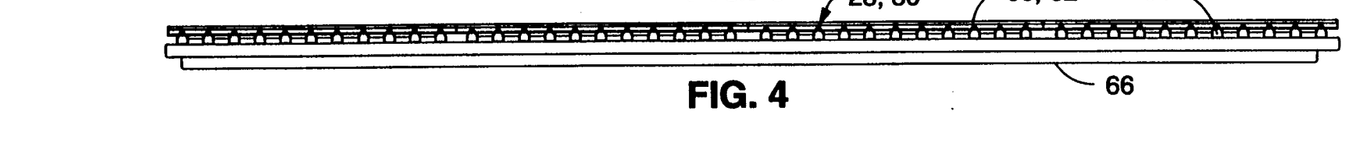
FIG. 4 is a side elevation view of the guide tracks of FIG. 3.

FIGS. 3 and 4 show the guide tracks 24 that are mounted to the top surface of the sealed chamber 50 of each transport module 12. As described above, central track 28 and two outer tracks 30 are interconnected by two connecting tracks 32. Four switches 36 connect each connecting track with either a central track or an outer track.

As best seen in FIG. 3, the guide tracks 24 and switches 36 of the present invention are preferably model railroad track and switches. Each track includes two parallel rails 60 and 62 joined to ties 64, with the ties resting on the top cover 66 of the sealed chamber 50. Model railroad G gauge (1:22.5 scale) with a track width of 45 mm is preferred, and is available from several sources including LGB (Lehmann Gross Bahn) of Germany. Also preferably, the rails of the track are composed of brass or some other non-ferrous or non-magnetic material to avoid interfering with the magnetic levitation of the wafer transporter 26. Electrically operated switches suitable for use as switches 36 of the present invention for transferring the transporters 26 between the guide tracks 24, are also readily available in G gauge. At the ends of the guide tracks 24, electrically conductive connectors (not shown) join the tracks to the tracks of an adjacent transport module. The connecting tracks 32 are arranged so that a transporter 26 on the connecting tracks 32 will not interfere with a transporter positioned at the docking port 34. Of course, track configurations different from that disclosed herein are also within the scope of the present invention.

The sealed chamber 50 of each transport module 12 is illustrated in FIGS. 5-8. The sealed chamber 50 extends horizontally between the intermodule interfaces 18 at each end and the transfer robot interface 20 at one side. The sealed chamber 50 includes a base member 68 with several standoffs 70, and a cover 66. The cover 66 is composed of a non-magnetic material such as polycarbonate or aluminum, which allows magnetic flux to pass therethrough and also allows visual monitoring of wafer carriers inside the sealed chamber. The cover is sealed to the base member 68 to prevent outside air from leaking into the sealed chamber if maintained at a subatmospheric pressure. The standoffs 70 support the cover 66 when the sealed chamber 50 is evacuated, and are positioned in areas not interfering with movement of the wafer transporters 26 along the guide tracks 24 or connecting tracks 32. As will be explained in greater detail below, wafer carriers move about inside the sealed chamber, so the standoffs must be positioned in areas not interfering with movement of the wafer carriers.

Figure 5:
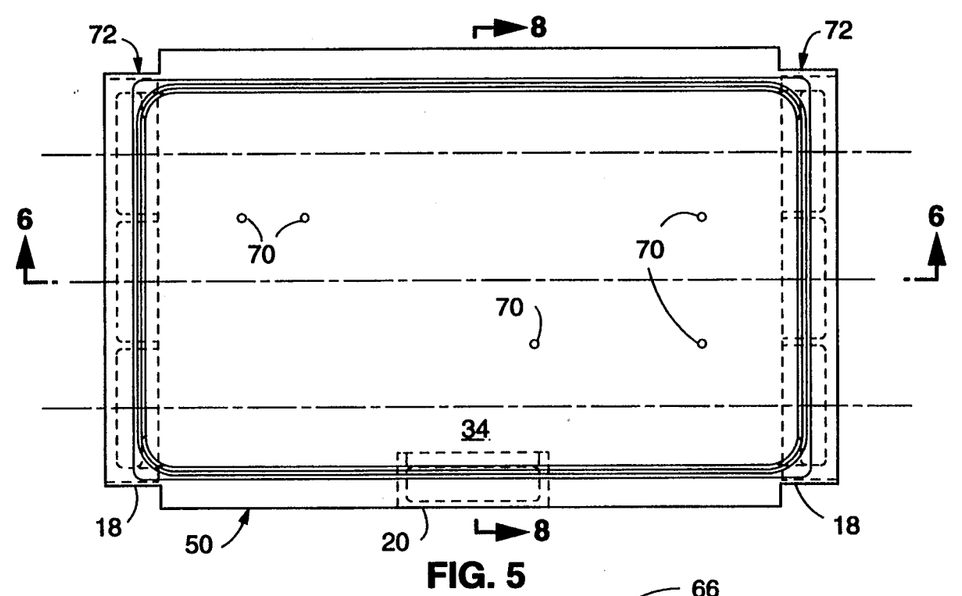
FIG. 5 is a plan view of a sealed chamber utilized in the transport module of FIGS. 1 and 2.
Figure 6:
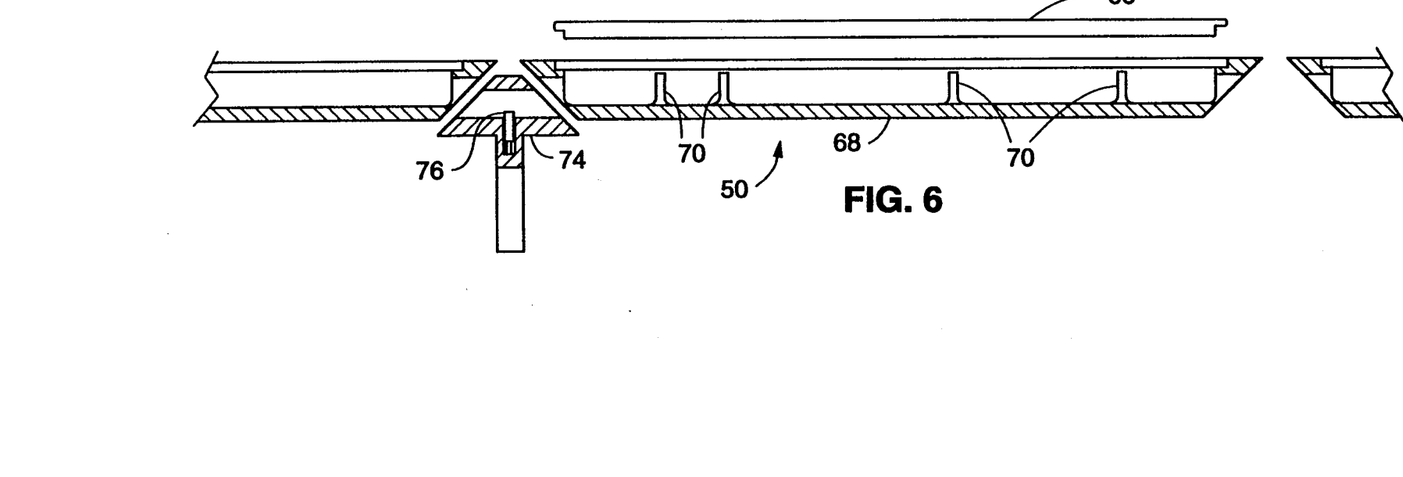
FIG. 6 is a side elevation sectional view of the sealed chamber and portions of two adjacent sealed chambers taken along section line 6—6 of FIG. 5.
Figures 7, 8:
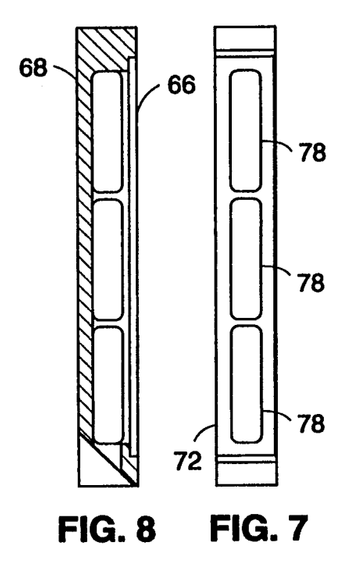
FIG. 7 is an end view of the sealed chamber of FIG. 5.
FIG. 8 is an end sectional view of the sealed chamber taken along section line 8—8 of FIG. 5.
Figure 9:
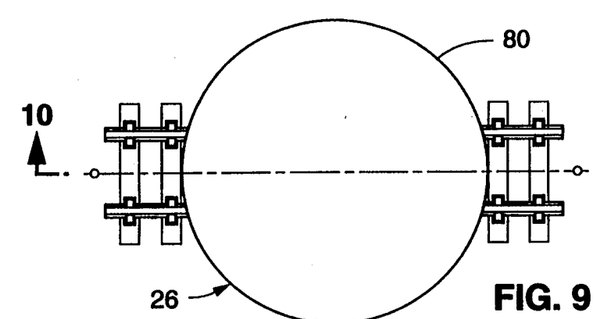
FIG. 9 is a plan view of a motorized transport vehicle of the present invention.

Each end 72 of the sealed chamber 50 is bevelled at a 45 degree angle to which is mated an interface valve 74 that seals against the bevelled surface. The interface valve 74 also mates with a sealed chamber of an adjacent transport module and, when the valve is open, the two sealed chambers are in communication with each other, allowing wafer carriers to move therebetween. The interface valve 74 includes a gate valve 76 that can be closed to facilitate the replacement or servicing of a transport module, while isolating the remaining transport modules and allowing processing to continue. Each end 72 of the sealed chamber 50 has three passages 78, each aligned with a guide track mounted to the top of the sealed chamber and each providing a passageway for a wafer carrier. Also shown in FIG. 5 is the transfer robot interface 20 located at the docking port 34. The transfer robot interface 20 also includes an interface valve coupling the sealed chamber to a transfer robot and providing a passageway for transfer of wafers between the transfer robot and the sealed chamber.

FIGS. 9-15 illustrate the wafer transporter 26, which includes a motorized vehicle 80 located outside the sealed chamber on the guide track 24 and a wafer carrier 82 located inside the sealed chamber and magnetically levitated by and coupled to the vehicle.

Referring now to FIGS. 9-13, the motorized vehicle 80 includes an upper portion in which are located electronic circuits and circuit boards 84, and a lower portion in which are located a drive motor and chassis 86, levitation electromagnets 88 and 90, and carrier position sensors 92. The electronic circuits and circuit boards 84 include a levitation control circuit and an electrical interface to a system controller, which are explained in more detail below with respect to FIGS. 16 and 17. The drive motor and chassis 86 runs on the guide track 24 and provides the motive power for moving the transporter throughout the wafer transport system 10. Its movement is controlled by the system controller. The drive motor and chassis 86 is preferably a model railroad motor and chassis with a direct current motor, and preferably G gauge (1:22.5 scale) with a track width of 45 mm. The drive motor and chassis 86 includes four wheels 94 that roll along the guide track 24 and a rail contact 96 that electrically contacts the rails 60 and 62 to supply power and control signals to the electronic circuits 84 of the vehicle. A housing 98 covers the inner components of the motorized vehicle 80. Batteries 100, if needed, are located between the electromagnets 88 and 90 and the circuit boards 84.

Referring to FIGS. 10, 11, 14, and 15, the wafer carrier 82 is a relatively flat component with no moving parts to generate particles within the sealed chamber. The wafer carrier 82 includes a housing 108 having a central disk-shaped region for housing permanent magnets 102, 104, and 106 above and a wafer 110 below. The wafer 110 rests on two arc-shaped shoulders 112 suspended below the housing. Mounted on the front and back of the housing 108 are two permanent magnets 114, and mounted to the underside of the housing are four alignment pins 116, all used for docking. The housing 108 is aluminum.

The wafer carrier 82 is magnetically levitated below the motorized vehicle 80 by magnetic interaction between the electromagnets 88 and 90 and carrier position sensors 92 of the vehicle and permanent magnets 102, 104, and 106 of the carrier, respectively. A levitation control circuit 120, shown in block diagram in FIG. 17, controls the levitation. The carrier position sensors 92 feedback the sensed distance between each pair of sensors 92 in the vehicle 80 and permanent magnets 106 in the carrier 82. The levitation control circuit 120 controls the current flowing in the electromagnets 88 to maintain the position of the carrier horizontal within the sealed chamber 50 and at a predetermined distance away from the top cover 66 of the sealed chamber. Electromagnets 90 in the motorized vehicle and associated permanent magnets 104 in the carrier 82 provide lateral coupling during movement of the transporter.

Figure 10:
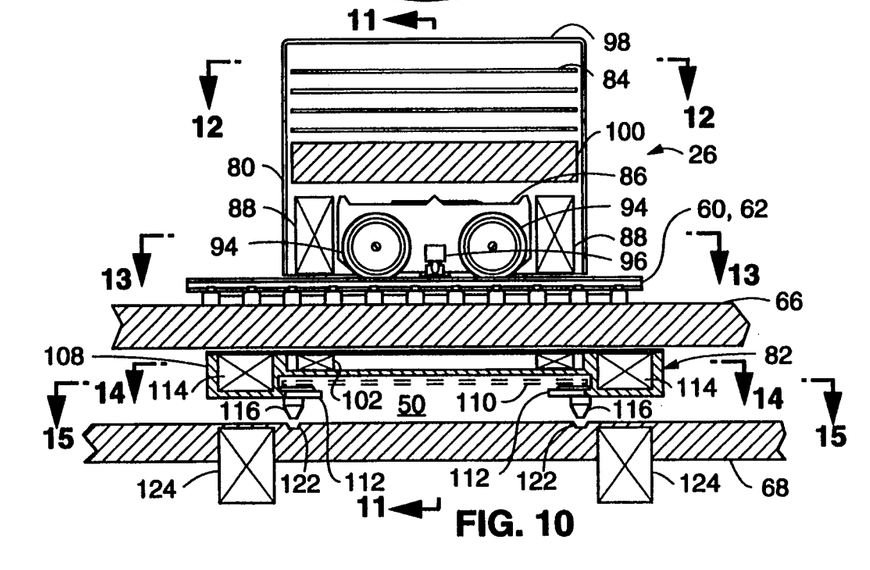
FIG. 10 is a side elevation sectional view of the motorized transport vehicle, the sealed chamber, and a material carrier within the chamber, as taken along section line 10—10 of FIG. 9.
Figure 11:
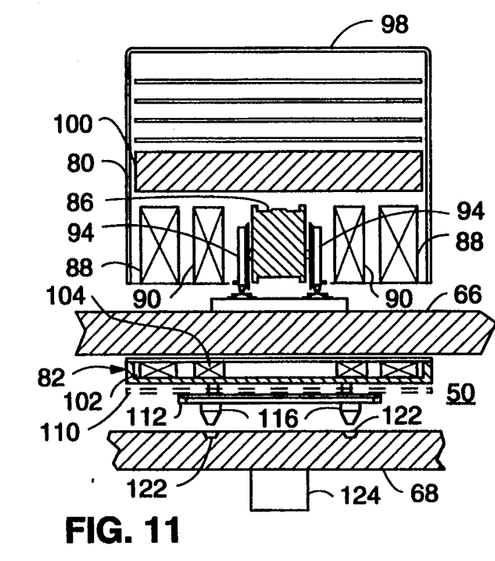
FIG. 11 is an end sectional view of the motorized transport vehicle, the sealed chamber, and the material carrier, as taken along section line 11—11 of FIG. 10.
Figure 12:
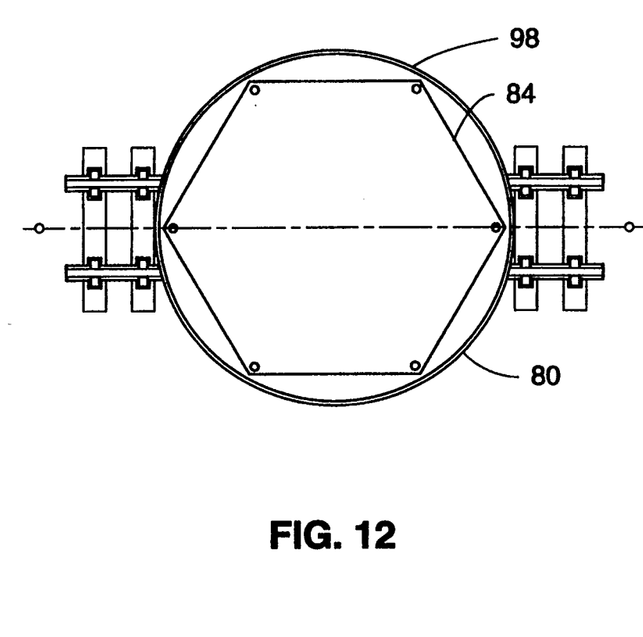
FIG. 12 is a plan sectional view of an upper portion of the motorized transport vehicle as taken along section line 12—12 of FIG. 10.
Figure 13:
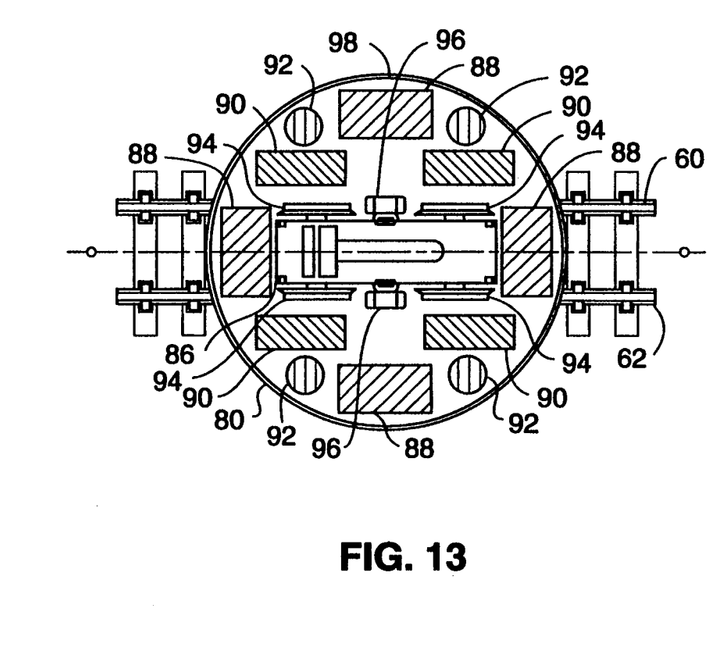
FIG. 13 is a plan sectional view of a lower portion of the motorized transport vehicle as taken along section line 13—13 of FIG. 10.
Figure 14:
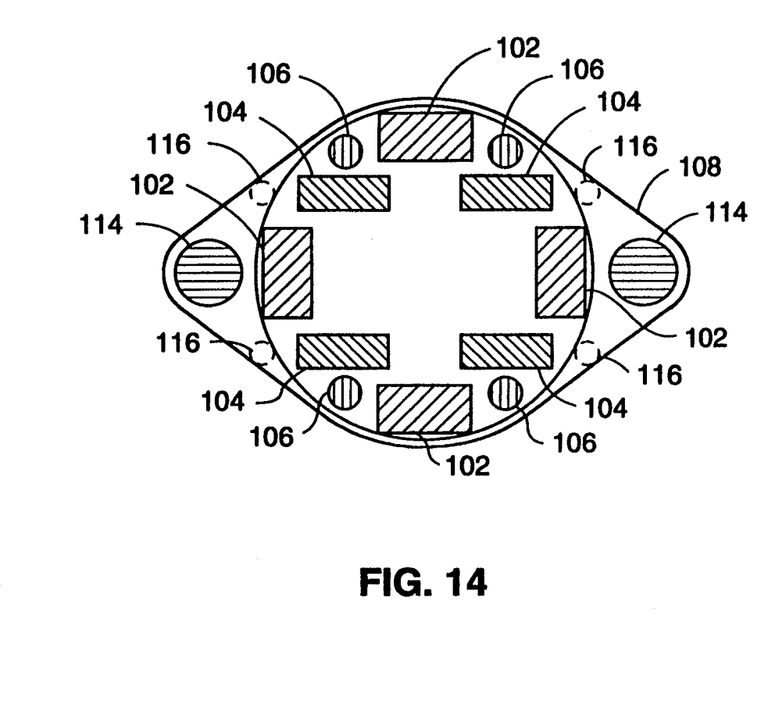
FIG. 14 is a plan section view of an upper portion of the material carrier as taken along section line 14—14 of FIG. 10.
Figure 15:
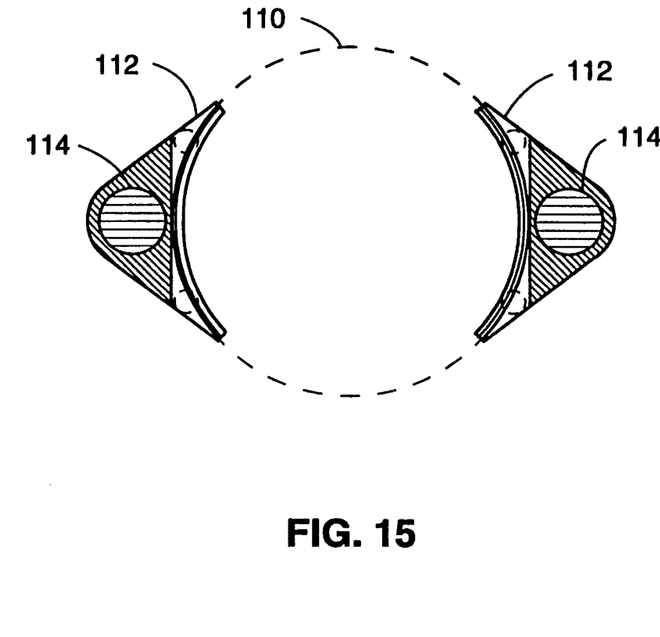
FIG. 15 is a plan section view of a lower portion of the material carrier as taken along section line 14—14 of FIG. 10.

FIGS. 10 and 11 show the wafer transporter 26 as it appears during transport of the wafer 110. Note that the wafer carrier 82 does not contact anything within the sealed chamber 50 in this position. When the transporter 26 is at the docking port 34 adjacent to a transfer robot interface 20, it is desirable to align the carrier and the wafer contained therein with the docking port to facilitate the transfer of a wafer between the carrier and the transfer robot. To do so, the transporter 26 is first moved to a position where the alignment pins 116 are positioned over corresponding alignment holes 122 in the base member 68 of the sealed chamber 50. Two alignment electromagnets 124 interact with alignment permanent magnets 114 on the carrier to stop and stabilize carrier at the docking port. Then, the levitation control circuit 120 reduces the levitation force on the carrier, allowing the carrier to move downward until the alignment pins 116 are inserted into the alignment holes and the carrier is docked.

While docked, a wafer 110 can be transferred between the carrier 82 and the transfer robot 14. Sufficient clearance is provided between the wafer 110 and the housing 106 of the carrier so that a wafer transfer robot (not shown) associated with a process module can reach under the wafer, then lift the wafer off of the shoulders 112, then move the wafer horizontally into the process module. Transfer of the wafer from the process module to the carrier is done by reversing the above steps. Once free of a wafer, the transporter 26 can remain at the docking port 34 to receive a wafer, or it can be reassigned to some other transport duty within the wafer transport system 10.

Figure 16:
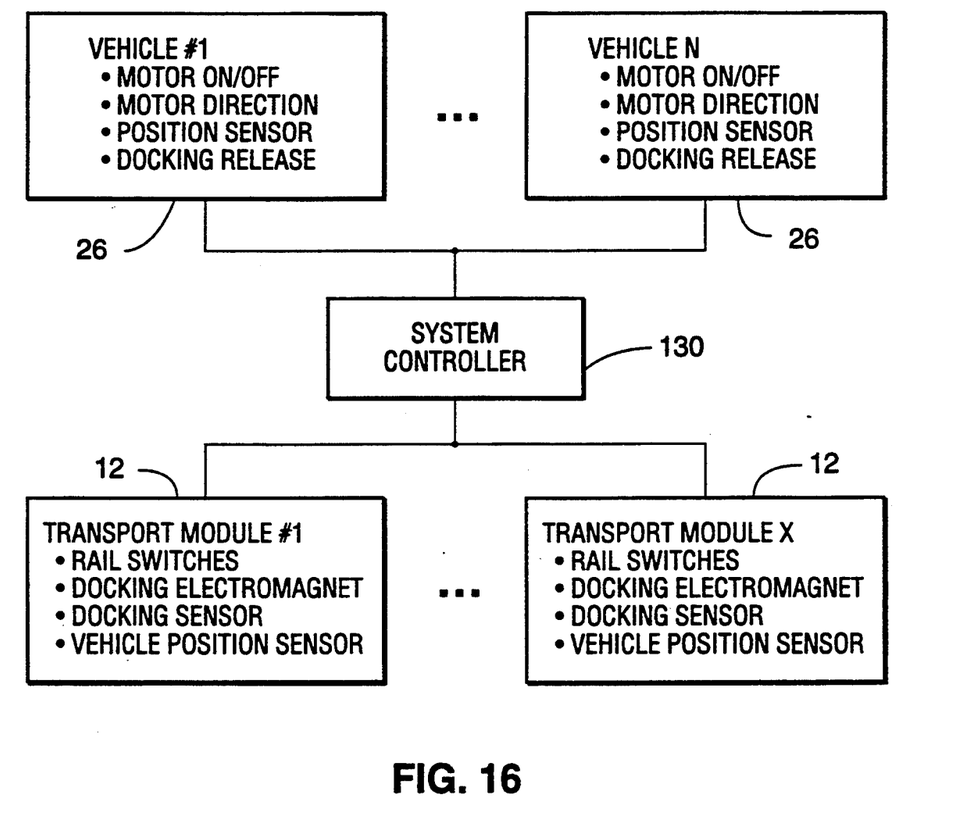
FIG. 16 is a block diagram of a system controller of the present invention.
Figure 17:
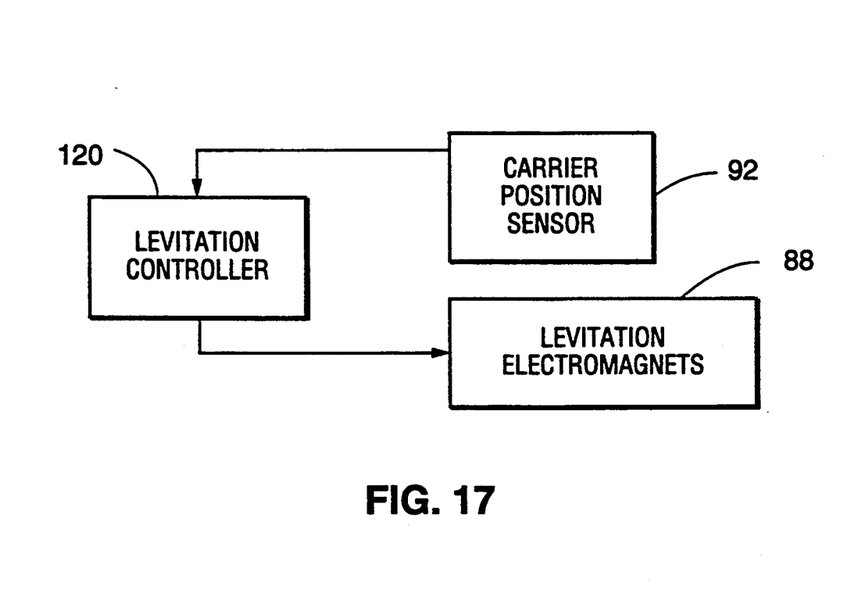
FIG. 17 is a block diagram of a levitation controller of the present invention.

A system controller 130, illustrated in FIG. 16, controls the movement and positioning of the wafer transporters 26, and also controls the docking operation. The system controller 130 communicates to all of the transporters 26 through the rails 60 and 62 of the guide tracks 24. The guide tracks supply direct current power to the transporters 26 and encoded signals from the system controller 130 superimposed on the d.c. power signal. The system controller directs each transporter 26 when to move (motor on) and how fast to accelerate, when to stop (motor off) and how fast to decelerate, which direction to move, and to reduce or increase the levitation force when docking or undocking. Each transporter 26 may include a position sensor that responds to encoded position information at or near the guide tracks 24, and this information is fed back to the system controller for keeping track of the transporter position.

The system controller 130 is also coupled to each transport module 12 for controlling transporter movement and docking. The system controller 130 is preferably hardwired to each rail switch 36 and to the alignment electromagnets 124. A docking sensor (not shown) attached to each transport module at the docking port may be used to verify that a carrier is at the docking port. Also, vehicle position sensors (not shown) mounted on or near the guide tracks can be used to sense the identity and movement of the transporters. Alignment electromagnets similar to the alignment electromagnets 124 can be placed at various locations, such as a docking queue, to stop and stabilize carriers at those locations.

From the above description, it will be apparent that the invention disclosed herein provides a novel and advantageous wafer transport system and its associated transporter apparatus. The foregoing discussion discloses and describes merely exemplary methods and embodiments of the present invention. As will be understood by those familiar with the art, the invention may be embodied in other specific forms without departing from the spirit or essential characteristics thereof. For example, the wafers could be transported by cassette, instead of individually; guide means other than a model train track could be used; track arrangements other than the three main track arrangement disclosed herein could be used; more (or fewer) main and connecting tracks could be used; additional transport lines could be added either directly or through a transfer robot; and materials other than wafers can be transported. Accordingly, the disclosure of the present invention is intended to be illustrative, but not limiting, of the scope of the invention, which is set forth in the following claims.

What is claimed is:

1. An apparatus for transporting material comprising:
   a chamber;
   two independently movable material transporters each including a motorized vehicle guided for movement outside the chamber, each including a material carrier disposed inside the chamber and having means for carrying material, and each including magnetic levitation means for magnetically coupling the material carrier below the motorized vehicle;
   guide means for guiding the movement of the motorized vehicles along the outside of the chamber on a top surface thereof, wherein the guide means includes means for permitting one material transporter to pass another material transporter in movement along the guide means; and
   control means for controlling the position of the motorized vehicle to move the material carrier to a desired position within the chamber.

2. An apparatus as recited in claim 1 wherein the chamber has a horizontal top surface composed of a non-magnetic material, wherein the motorized vehicles and the guide means are coupled to the horizontal top surface outside the chamber and the material carriers are disposed below the horizontal top surface inside the chamber, and wherein the magnetic levitation means suspends the material carriers below the motorized vehicles and away from contact with the chamber during movement of the material transporters.

3. An apparatus as recited in claim 1 wherein the chamber and the guide means extends past a plurality of docking ports, and wherein each docking port includes means through which material is transferred to and from a material carrier that is positioned adjacent the docking port.

4. An apparatus as recited in claim 3 wherein each docking port includes alignment means for aligning one of the material carriers with the docking port.

5. An apparatus as recited in claim 4 wherein the alignment means includes an alignment pin associated with each material carrier and a corresponding alignment hole associated with each docking port.

6. An apparatus as recited in claim 4 wherein the alignment means includes an alignment magnet associated with each docking port and an alignment magnet associated with each material carrier, and wherein the alignment magnets are positioned to align the material carrier at the docking port.

7. An apparatus as recited in claim 1 wherein each motorized vehicle includes a chassis, a reversible electric motor mounted on the chassis, wheels mounted on the chassis, and a drive mechanism coupling the motor to the wheels.

8. An apparatus as recited in claim 7 wherein each motorized vehicle includes a model railroad motor and chassis.

9. An apparatus as recited in claim 1 wherein the material to be transported is a flat wafer, and wherein each material carrier includes means for horizontally supporting a wafer and includes clearance between the wafer and the material carrier to allow the wafer to be transferred to and from the material carrier.

10. An apparatus as recited in claim 1 wherein the magnetic levitation means of each material transporter includes an electromagnet coupled to the motorized vehicle and a corresponding permanent magnet coupled to the material carrier and further includes levitation control means for controlling current in the electromagnet in the motorized vehicle to maintain the position of the material carrier with respect to the motorized vehicle.

11. An apparatus as recited in claim 10 wherein the levitation control means includes a sensor for providing feedback of the position of the material carrier and a position control circuit responsive to the position feedback for controlling the current to the electromagnet in the motorized vehicle.

12. An apparatus as recited in claim 1 wherein the guide means includes a guide track mounted horizontally outside the chamber said top surface thereof.

13. An apparatus as recited in claim 1 wherein the guide means includes two guide tracks mounted horizontally outside the chamber to said top surface thereof, and includes a connecting track interconnecting the guide tracks.

14. An apparatus as recited in claim 13 further including a switch at each junction between a guide track and the connecting track.

15. An apparatus as recited in claim 14 wherein the control means includes means for controlling the junction switches to control the transfer of the material transporters between guide tracks.

16. An apparatus as recited in claim 13 wherein the guide means includes three parallel guide tracks and two connecting tracks each connecting an outer guide track to a middle guide track.

17. An apparatus as recited in claim 13 wherein the guide tracks and connecting tracks are composed of non-magnetic materials.

18. An apparatus as recited in claim 13 wherein the guide tracks and connecting tracks are model railroad track.

19. An apparatus as recited in claim 1 wherein the control means includes docking means for positioning each material carrier at each docking port, and wherein the docking means includes a docking position sensor for sensing when a material carrier is at a docking port, includes an alignment electromagnet for aligning the material carrier at the docking port, and includes means coupled to the magnetic levitation means for reducing the magnetic coupling between the material carrier and the motorized vehicle when the material carrier is at the docking port.

20. An apparatus as recited in claim 1 wherein the control means includes transporter control means for controlling the movement and positioning of the material transporters, wherein the transporter control means includes means coupled to the motorized vehicles for controlling forward and reverse movement of the motorized vehicles.

21. An apparatus as recited in claim 20 wherein the guide means includes two guide tracks mounted outside the chamber to said top surface thereof, includes a connecting track interconnecting the guide tracks, and includes a switch at each junction between a guide track and the connecting track, and wherein the transporter control means includes means coupled to the junction switch for defining a path along the guide tracks and connecting track for movement of the motorized vehicles.

22. A material transporter for transporting materials within a chamber, wherein a guide track is positioned outside the chambers on an upper surface of the chamber, said material transporter comprising:
   a motorized vehicle having self-contained motor and drive means and movable on top of the guide track outside the chamber, wherein the motorized vehicle includes wheels at a bottom side thereof that ride on the guide track;
   a material carrier disposed inside the chamber below the motorized vehicle and having means for carrying material; and
   magnetic levitation means for magnetically suspending the material carrier below the motorized vehicle and away from contact with the chamber during movement of the material transporter and for magnetically coupling the material carrier to the motorized vehicle for movement therewith.

23. A material transporter as recited in claim 22 wherein the motorized vehicle includes a chassis, a reversible electric motor mounted on the chassis, wheels mounted on the chassis, and a drive mechanism coupling the motor to the wheels.

24. A material transporter as recited in claim 23 wherein the motorized vehicle includes a model railroad motor and chassis.

25. A material transporter as recited in claim 22 wherein the material to be transported is a flat wafer, and wherein the material carrier includes means for horizontally supporting a wafer and includes clearance between the wafer and the material carrier to allow the wafer to be transferred to and from the material carrier.

26. A material transporter as recited in claim 22 wherein the material carrier includes docking alignment pins for aligning the material carrier within the chamber at a desired position for transfer of material.

27. A material transporter as recited in claim 22 wherein the magnetic levitation means includes an electromagnet coupled to the motorized vehicle and a corresponding permanent magnet coupled to the material carrier and further includes levitation control means for controlling current in the electromagnet to maintain the position of the material carrier with respect to the motorized vehicle.

28. A material transporter as recited in claim 27 wherein the levitation control means includes a sensor for providing feedback of the position of the material carrier and a position control circuit responsive to the position feedback for controlling the current to the electromagnet.

* * * * *